(12) United States Patent
Tsumura et al.

(10) Patent No.: US 8,263,870 B2
(45) Date of Patent: Sep. 11, 2012

(54) HEAT DISSIPATING WIRING BOARD, METHOD FOR MANUFACTURING SAME, AND ELECTRIC DEVICE USING HEAT DISSIPATING WIRING BOARD

(75) Inventors: Tetsuya Tsumura, Kadoma (JP); Hiroharu Nishiyama, Kadoma (JP); Etsuo Tsujimoto, Kadoma (JP)

(73) Assignee: Panasonic Corporation, Osaka (JP)

( * ) Notice: Subject to any disclaimer, the term of this patent is extended or adjusted under 35 U.S.C. 154(b) by 936 days.

(21) Appl. No.: 12/065,915

(22) PCT Filed: Sep. 25, 2006

(86) PCT No.: PCT/JP2006/318927
§ 371 (c)(1),
(2), (4) Date: Mar. 6, 2008

(87) PCT Pub. No.: WO2007/037190
PCT Pub. Date: Apr. 5, 2007

(65) Prior Publication Data
US 2009/0266584 A1    Oct. 29, 2009

(30) Foreign Application Priority Data

Sep. 27, 2005  (JP) .................................. 2005-279728

(51) Int. Cl.
H05K 1/00  (2006.01)
H05K 1/03  (2006.01)
H05K 1/16  (2006.01)
H05K 7/20  (2006.01)
H05K 3/20  (2006.01)

(52) U.S. Cl. ........ 174/252; 174/255; 174/260; 361/707; 361/709; 361/723; 29/831

(58) Field of Classification Search .................. None
See application file for complete search history.

(56) References Cited

U.S. PATENT DOCUMENTS

| | | | |
|---|---|---|---|
| 5,703,399 A | 12/1997 | Majumdar et al. | 257/723 |
| 5,792,676 A | 8/1998 | Masumoto et al. | 438/111 |
| 6,501,156 B1 | 12/2002 | Nakanishi et al. | 257/666 |
| 2003/0015775 A1* | 1/2003 | Minamio et al. | 257/676 |
| 2004/0026766 A1* | 2/2004 | Schmitz et al. | 257/662 |
| 2004/0036147 A1* | 2/2004 | Watanabe et al. | 257/620 |
| 2005/0158916 A1* | 7/2005 | Hirano et al. | 438/122 |

FOREIGN PATENT DOCUMENTS

| | | |
|---|---|---|
| JP | 61-039555 | 2/1986 |
| JP | 09-102571 | 4/1997 |
| JP | 09-139461 | 5/1997 |
| JP | 2001-057408 | 2/2001 |
| JP | 2001-148456 | 5/2001 |
| JP | 2003-060346 | * 2/2003 |

* cited by examiner

Primary Examiner — Jayprakash N Gandhi
Assistant Examiner — Dion Ferguson
(74) Attorney, Agent, or Firm — Steptoe & Johnson LLP (57) ABSTRACT

It is an object to improve a conventional point that mounting an electronic component that requires a high current and heat radiation, such as an LED, together with other general electronic components on the same board has been difficult. To achieve this object, a different thickness lead frame partially having different thicknesses is used. On a thick portion of the different thickness lead frame, a special electronic component, such as an LED, for which a high current and heat radiation are required is mounted. Further, a thin portion of the different thickness lead frame is formed at a fine pitch, and general electronic components are mounted at a high density on the thin portion. Thus, unitization or modularization of electronic components for which a high current and heat radiation are required becomes possible.

24 Claims, 10 Drawing Sheets

FIG. 10
PRIOR ART

HEAT DISSIPATING WIRING BOARD, METHOD FOR MANUFACTURING SAME, AND ELECTRIC DEVICE USING HEAT DISSIPATING WIRING BOARD

TECHNICAL FIELD

The present invention relates to a heat radiating or dissipating wiring board and a manufacturing method therefor, and an electrical apparatus or device using the heat radiating or dissipating wiring board.

BACKGROUND ART

In recent years, as higher performance and size reduction of electronic apparatuses have been demanded, producing electronic components with higher density and higher performance have been further demanded. By making electronic components smaller, high-functional, and more effective to address such demands, their temperature rises. This temperature rise poses a large problem. A method for increasing heat radiation of an electronic component has therefore become important. Description will be given below taking a light emitting diode (LED) as an example of the electronic component for which heat generation is problematic.

Among electronic components, an LED has characteristics that the amount of light emission decreases when the temperature rises too high. Therefore, heat radiation is essential for increasing the amount of light emission. As a technique for increasing heat radiation, a method is known that attaches an LED onto a metallic board and diffuses heat from the back surface of the LED.

Figure 10:
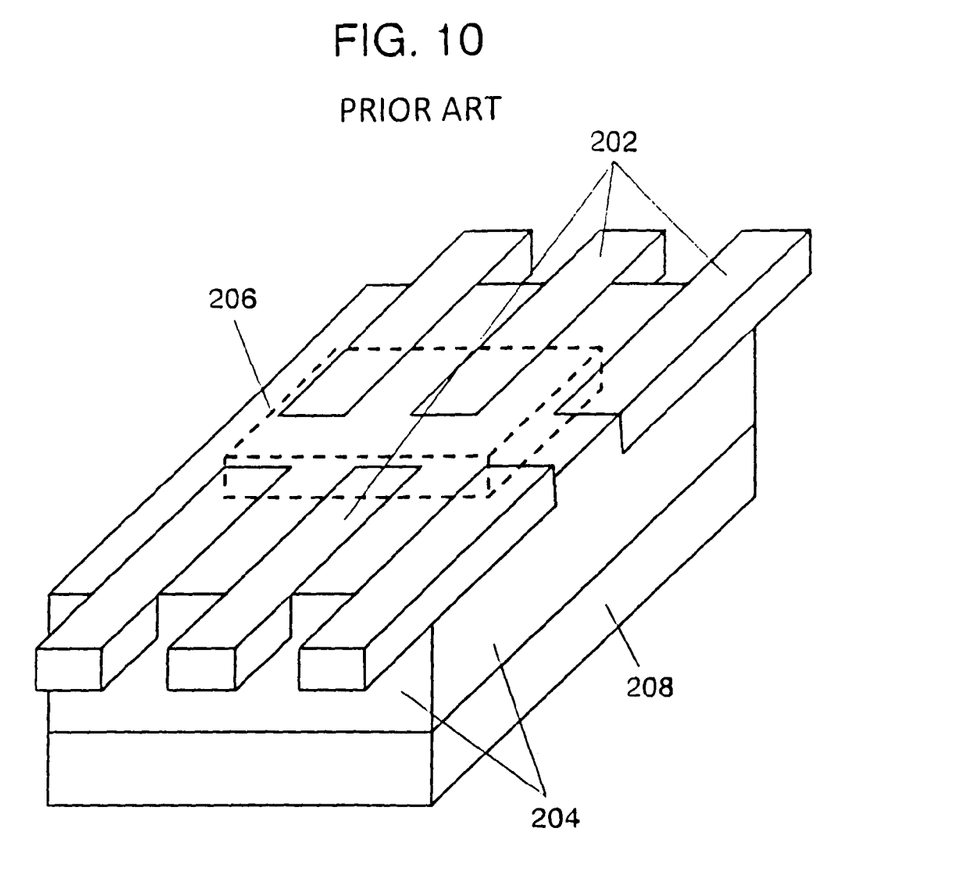
FIG. 10 is a perspective view illustrating one example of a conventional heat radiating wiring board.

FIG. 10 is a perspective view illustrating one example of a conventional heat radiating wiring board. In FIG. 10, lead frame 202 is embedded in resin 204. LED 206 and other components are to be mounted on lead frame 202. Here, heat radiation of LED 206 is transmitted through resin 204 to heat sink 208. In this way, heat is radiated through lead frame 202 and heat sink 208. Such a technique is described in Unexamined Japanese Patent Publication No. 2001-57408.

Here, if a large number of LEDs 206 are mounted and driven, a high current, e.g., of 30 to 150 A is required. To accept such a high current, the thickness (sectional area) of lead frame 202 needs to be increased. As a result, lead frame 202 needs to be thicker. However, if lead frame 202 is made thick, it becomes difficult to make lead frame 202 in a finer wiring shape by press working. Specifically, in press working of lead frame 202, the limit to making a finer shape is around the thickness of lead frame 202. That is, in the case of a thickness of 0.5 mm, the limit of the pattern width is 0.5 mm. It is very difficult with a thickness of 0.5 mm to make a fine pattern such as a pattern having a pattern width of 0.3 mm or 0.4 mm. To make the pattern width as in a typical print wiring circuit to 0.2 mm or 0.1 mm, the thickness of lead frame 202 needs to be reduced to 0.2 mm or 0.1 mm. With such a thickness (or sectional area), a high current for driving LED 206 cannot be accepted.

On the other hand, users have a need for LED 206 that has a high-level control circuit to realize light emission in accordance with applications. In such a case, a control circuit and a control semiconductor for LED 206 need to be mounted around LED 206. However, in a conventional high heat radiating board, since its circuit pattern constituted of lead frame 202 is a non-dense pattern provided for a high current, a dense pattern for mounting a semiconductor and the like cannot be formed. Therefore, a peripheral circuit of LED 206 cannot be surface mounted together with LED 206 on the same board, and is separately mounted on another board.

In particular, in the case of LEDs for various backlight and lighting, the needs for which have recently been increasing, it is necessary that LED 206 in array including a plurality of LEDs 206 are highly controlled by an electronic circuit. In aspects of low cost and compact size, it has been desired that a heat generating electronic component, such as LED 206, that requires a high current and heat radiation be mounted together with a general circuit component on the same board.

In the foregoing conventional structure, a high current, e.g., of 100 A (A stands for "ampere", a unit used for measuring current) is required for driving LED 206. Further, for heat radiation of LED 206, a further increase in thickness of lead frame 202 has been promoted in a wiring board including lead frame 202. The resulting pattern of lead frame 202 is non-dense. Therefore, the conventional structure has a problem that it is difficult to mount a semiconductor circuit component for driving LED 206 together with LED 206 on the same board.

DISCLOSURE OF THE INVENTION

The present invention is to solve the foregoing problem and to provide a heat radiating wiring board that further promotes acceptance of a high current and higher heat radiation and allows a fine component such as a semiconductor or a chip component to be mounted together with a heat generating electronic component on the same board.

Also, to solve the foregoing issues, a circuit pattern constituted of a metal wiring plate where the thickness is partially thin is attached to or embedded in a resin plate having insulating properties into which filler is mixed.

With the above structure, a heat radiating wiring board of the invention uses a circuit pattern constituted of a metal wiring plate where the thickness is partially thin. Therefore, if a heat generating electronic component such as an LED is mounted on a thin portion, heat is transmitted to a thick portion integrated with the thin portion. This enables efficient heat radiation. Alternatively, if a thick portion is used for a part for an LED and the like in which a high current and heat radiation are required whereas a thin portion is used for a part in which surface mounting of a circuit component such as a semiconductor or a chip component at a high density is required, the flowing of a high current of several tens to 100 A or more as for the LED and the like can be accepted in the thick portion and the LED can be efficiently cooled by utilizing the thickness of the thick portion. Further, a semiconductor component and the like to control the LED and the like can be mounted in the vicinity of the LED and the like at a high density by utilizing the thin portion. Thus, the LED and the like and their peripheral circuit components and the like can be mounted on one heat radiating wiring board, and therefore unitization and modularization, e.g., of LEDs become possible. Size reduction and cost reduction of products become possible.

REFERENCE MARKS IN THE DRAWINGS

100 Different thickness lead frame
102 LED
104 Control IC
106 Chip component
108 Composite resin plate
110 Heat sink
112 Thick portion
114 Thin portion
116 Resin
118 Filler
122 Copper material
124 Air permeability stainproof film
126 Burr
128 High-current heat radiation portion
130 Signal circuit portion
132 Control component
134 Power component
136 Terminal electrode
138 Heat radiation fin
140 Another component

PREFERRED EMBODIMENTS FOR CARRYING OUT OF THE INVENTION

The present invention will be described below using embodiments with reference to the drawings.
(First Embodiment)
A first embodiment is described with reference to the drawings.

Figure 1A:
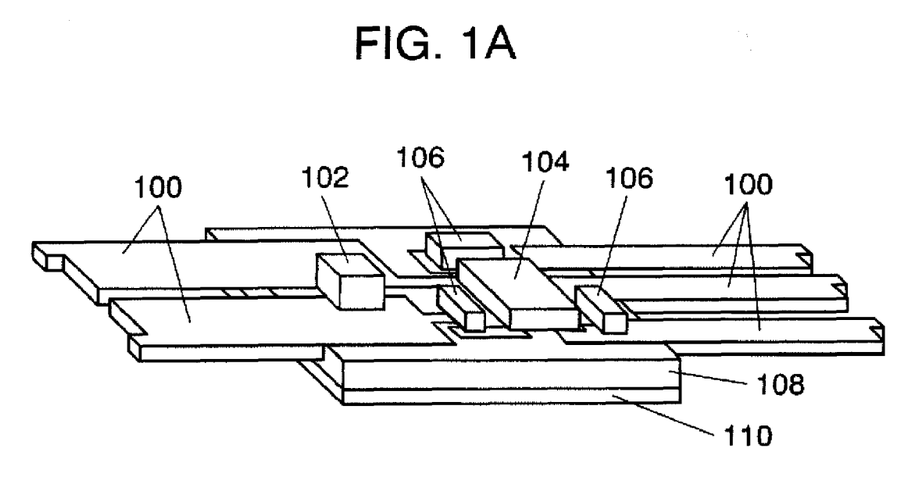
FIG. 1A is a perspective view of a heat radiating wiring board of a first embodiment of the invention.
Figure 1B:
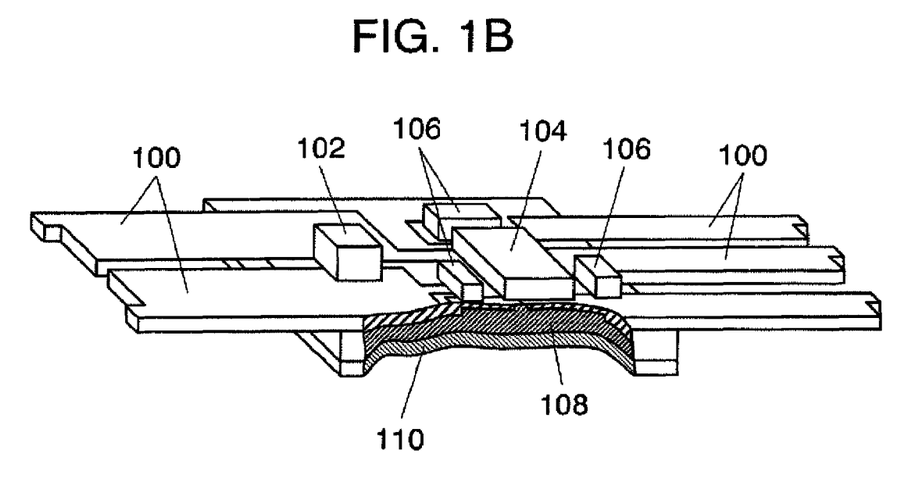
FIG. 1B is a partially cutaway perspective view of the heat radiating wiring board of the first embodiment of the invention.

FIG. 1A is a perspective view in the state where an LED is mounted on a heat radiating wiring board in a first embodiment. FIG. 1B is a partially sectional view of FIG. 1A.

In FIG. 1A, a high-heating, high-current element such as LED 102 is mounted on different thickness lead frame 100 used as a circuit pattern. Control IC 104 for controlling LED 102 and chip component 106 are mounted on the same different thickness lead frame 100. Different thickness lead frame 100 is integrated with heat sink 110 disposed on the lower surface of this composite resin plate 108 with composite resin plate 108 interposed therebetween. This heat sink 110 is attached to composite resin plate 108 while being non-conducting with different thickness lead frame 100. Note that terminal electrodes for mounting such as LED 102 and control IC 104 are not illustrated. Needless to say, the configuration illustrated in FIGS. 1A and 1B can be made denser by surface mounting LED 102 and control IC 104.

In FIG. 1B, shadow areas illustrate partial sections of a heat radiating wiring board in the first embodiment. Referring to FIG. 1B, it is found that different thickness lead frame 100 has partly a thick portion and partly a thin portion. A conventional lead frame is made of a uniform thickness. On the other hand, in a heat radiating wiring board of the present first embodiment, a combination of different thickness lead frames 100, which each have partially varied thicknesses in the same plate, is used as the lead frame. The different thickness lead frames 100 are embedded in composite resin plate 108 such that the top surface of composite resin plate 108 is substantially flush with the top surfaces of different thickness lead frames 100. Thus, the different thickness lead frames 100 are integrated with heat sink 110.

Figure 2:
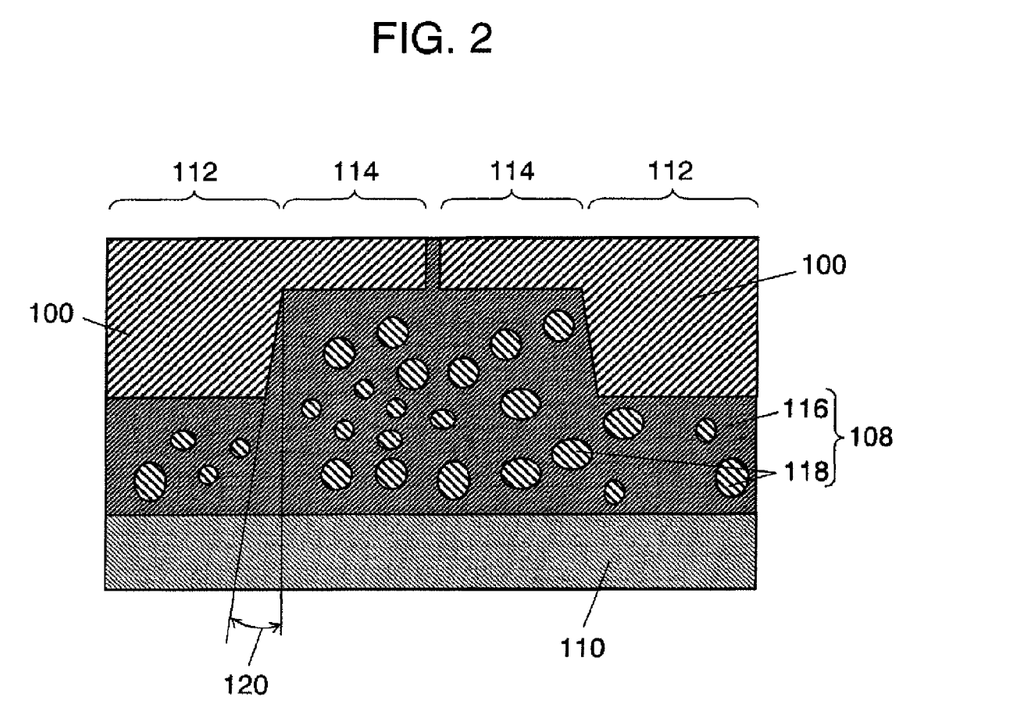
FIG. 2 is an enlarged sectional view of the heat radiating wiring board in the first embodiment.

Next, description is given in further detail with reference to FIG. 2. FIG. 2 is an enlarged sectional view of a heat radiating wiring board in the first embodiment. As illustrated in FIG. 2, different thickness lead frame 100 consists of thick portion 112 and thin portion 114. As illustrated in FIG. 2, a thickness of resin plate 108 between the thick portion 112 and heat sink 110 is thinner than a resin plate 108 between thin portion 114 and heat sink 110. In the present embodiment, lead frames 100 adjacent to each other are disposed such that their thin portions 114 face each other and have substantially the same thickness. Note that the thickness of thin portion 114 may differ between adjacent lead frames 100. In that case, if lead frame 100 having a larger thickness is mounted so as to face a heat generating portion of an electronic component, a finer wiring pattern and high heat radiation can be concurrently achieved.

Composite resin plate 108 is composed of filler 118 and resin 116. Note that inorganic filler is preferable as filler 118. It is preferable that the inorganic filler contains at least one selected from $Al_2O_3$, MgO, $SiO_2$, BN, and AlN. In addition, the use of inorganic filler allows an increase in heat radiation, and particularly the use of MgO allows an increase in coefficient of linear thermal expansion. The use of $SiO_2$ allows reduction in dielectric constant, and the use of BN allows reduction in coefficient of linear thermal expansion.

Arrow 120 represents an angle of a step between thick portion 112 and thin portion 114 from the vertical plane. The angle represented by arrow 120 is preferably not less than 0 degree nor more than 45 degrees, and more preferably not less than 0 degree nor more than 30 degrees. In the case of using a rolling method excellent in productivity and dimensional stability, it is difficult to achieve an angle of less than 0 degree. If the angle is more than 45 degrees, the control becomes difficult. Therefore, by making the angle represented by arrow 120 to be around 5 degrees (preferably from 3 to 10 degrees, and more preferably from 5 to 7 degrees), different thickness lead frame 100 concurrently including thick portion 112 and thin portion 114 with stabled thickness dimensions (and the minimum residual strain) can be manufactured from a single plate.

Note that, as the material for different thickness lead frame 100, a material mainly containing copper is preferable. This is because copper is excellent in both thermal conductivity and electrical conductivity. In this case, tough pitch copper containing copper of a content not less than 99.90% nor more than 99.99% and a minute amount (0.02 to 0.05%) of oxygen is used in the embodiment. In addition to being excellent in thermal conductivity and electrical conductivity, this tough pitch copper is low in hardness (hardness is 87 HB or less) as compared, e.g., to oxygen-free copper (hardness is 112 HB or less) because of containing oxygen, and is excellent in workability by laser machining and press working. Note that if improvement of workability is to take priority over that of thermal conductivity and electrical conductivity, annealed copper should be used, whereas if thermal conductivity and electrical conductivity are to take priority over workability, oxygen-free copper should be used.

An additive agent other than copper is preferably added to the foregoing copper materials. For example, a copper material of Cu+Sn may be used. In the case of Sn, adding Sn of not less than 0.1 wt % nor more than 0.15 wt % allows the softening temperature of a copper material to be increased up to 400° C. For the purpose of comparison, different thickness lead frame 100 illustrated in FIGS. 1A and 1B was fabricated using copper without Sn (Cu>99.96 wt %). Although the electrical conductivity was high, distortion occurred in some cases in the completed heat radiating wiring board, particularly in thin portion 114 (further, in a connection portion of thin portion 114 and thick portion 112). As a result of detail examination, it was expected that the heat radiating wiring board could be deformed during later component mounting (during soldering) and in a reliability test (repeating heat generation and cooling, etc.,) after LED mounting because the softening point of the material was low, around 200° C.

On the other hand, when a copper material of Cu+Sn>99.96 wt % was used, there was no influence of heat generation caused by component mounting and an LED. Soldering and die-bonding were not influenced. Then, the softening point of this material was measured. As a result, it was found that the softening point was 400° C. Thus, it is preferable that copper be mainly used and several elements be added. The element added to copper, in the case of Zr, is preferably in a range of not less than 0.015 wt % nor more than 0.15 wt %. If the added amount is less than 0.015 wt %, the increase effect of the softening temperature may be small. If the added amount is more than 0.15 wt %, electrical characteristics may be affected. Addition of Ni, Si, Zn, P, and the like can increase the softening temperature. In this case, preferably Ni is not less than 0.1 wt % nor more than 5 wt %, Si not less than 0.01 wt % nor more than 2 wt %, Zn not less than 0.1 wt % nor more than 5 wt %, and P not less than 0.005 wt % nor more than 0.1 wt %. Adding these elements in these ranges alone or in plural uses can increase the softening point of a copper material. Note that if the added amount is smaller than the percentage described here, the softening point increase effect may be low. If the added amount is larger than the percentage described here, there is a possibility of the influence on the electrical conductivity. Likewise, not less than 0.1 wt % nor more than 5 wt % is preferable in the case of Fe, and not less than 0.05 wt % nor more than 1 wt % in the case of Cr. Other points of these elements are the same as for the above-described elements.

In addition, the tensile strength of a copper alloy is preferably 600 N/mm$^2$ or less. If a material has a tensile strength of more than 600 N/mm$^2$, the tensile strength may affect the workability of different thickness lead frame 100. Such a material having a high tensile strength tends to have an increased electrical resistance, and therefore may be not suitable for high-current applications of LED 102 and the like as used in the first embodiment. On the other hand, a material having a tensile strength of 600 N/mm$^2$ or less has a high content of Cu and has a high electrical conductivity, and therefore is suitable for high-current applications of LED and the like as used in the first embodiment. The material is soft, and therefore is excellent in workability. Thus, the material is appropriate for high-current applications of LED and the like as used in the first embodiment.

Note that forming in advance a solder layer and a tin layer on a surface exposed from composite resin plate 108 of different thickness lead frame 100 (a surface on which LED 102, control IC 104, and chip component 106 are mounted) can facilitate mounting components onto different thickness lead frame 100 and enables wires to be prevented from rust. In addition, a solder layer is preferably not formed on a surface in contact with (or a surface embedded in) composite resin plate 108 of different thickness lead frame 100. If a solder layer and a tin layer are formed on a surface in contact with composite resin plate 108 in this way, this layer may become soft during soldering, affecting adhesion (or bond strength) of different thickness lead frame 100 and composite resin plate 108. The solder layer and the tin layer are not illustrated in FIGS. 1A, 1B and 2.

The inorganic filler is substantially spherical, and its diameter is from 0.1 to 100 μm. The smaller the particle size, the more the filling factor to resin 116 can be increased. Therefore, composite resin plate 108 is filled with high concentration such that the filling amount (or content) of inorganic filler in composite resin plate 108 is from 70 to 95 percent by weight, in order to increase the thermal conductivity. In particular, in the embodiment, a mixture of two kinds of $Al_2O_3$, one having an average particle size of 3μ and the other having an average particle size of 12μ, is used as the inorganic filler. The use of the two kinds of $Al_2O_3$, one having a small average particle size and the other having a large average particle size, makes it possible to fill gaps of $Al_2O_3$ having a large particle size with $Al_2O_3$ having a small particle size. Thus, composite resin plate 108 can be filled with a high concentration of $Al_2O_3$, close to 90 percent by weight. As a result, the thermal conductivity of composite resin plate 108 is about 5 W/mK. Note that if the filling factor of filler 118 is less than 70 percent by weight, the thermal conductivity may be decreased. If the filling factor (or content) of filler 118 is more than 95 percent by weight, the moldability of uncured composite resin plate 108 may be affected. There is therefore a possibility of affecting the adhesion of composite resin plate 108 and different thickness lead frame 100 (e.g., in the case of different thickness lead frame 100 embedded in composite resin plate 108 and in the case of different thickness lead frame 100 attached to the surface of composite resin plate 108) to affect resin flowing around a fine wiring portion formed in thin portion 114.

Note that thermosetting, insulating resin contains at least one kind of resin among epoxy resin, phenol resin, and cyanate resin. These kinds of resin are excellent in heat resistance and electrical insulating properties.

If the thickness of an insulator composed of composite resin plate 108 is reduced, heat generated in LED 102 mounted on different thickness lead frame 100 is easily transmitted to heat sink 110 while withstand voltage becomes problematic. If the thickness is too large, the heat resistance increases. The thickness should therefore be set to the optimum value in consideration of the withstand voltage and the heat resistance.

Metal heat sink 110 is preferably made of aluminum or copper, which is good in heat conduction, or an alloy mainly composed thereof. In particular, in the embodiment, the thickness of heat sink 110 is 1 mm. Heat sink 110 is not limited only to being plate-shaped. To more increase the heat radiation, a heat radiation fin portion for enlarging the surface area may be formed on a surface opposite to the surface on which composite resin plate 108 is laminated. The coefficient of linear expansion of heat radiating wiring board is from $8 \times 10^{-6}/°$ C. to $20 \times 10^{-6}/°$ C. By bringing this coefficient of linear expansion close to those of heat sink 110 and LED 102, warping and distortion of the entire board can be reduced. In surface mounting of these components, mutual matching of their coefficients of thermal expansion is important in terms of reliability.

The thickness of thick portion 112 of different thickness lead frame 100 is preferably not less than 0.3 mm nor more than 1.0 mm (more preferably not less than 0.4 mm nor more than 0.8 mm). This is because a high current (e.g., 30 A to 150 A, the current may further increase depending on the number of LEDs 102 to be driven) is required to control LED 102. The thickness of thin portion 114 of different thickness lead frame 100 is preferably not less than 0.05 mm nor more than 0.3 mm. If the thickness of thin portion 114 is less than 0.05 mm, pressing may become difficult. If the thickness of thin portion 114 exceeds 0.3 mm, fine patterning is affected during cutting-out by a press. Note that the thickness difference between thick portion 112 and thin portion 114 in different thickness lead frame 100 should be not less than 0.1 mm nor more than 0.7 mm. If the thickness difference is less than 0.1 mm, the effect caused by changing the thickness may be not obtained. If the thickness difference exceeds 0.7 mm, there is a possibility that the formation accuracy in roll forming (or cut forming) of a single plate is affected. In this way, for example, if thick portion 112 has a thickness of 0.5 mm and thin portion 114 has a thickness of 0.2 mm, the thickness of thick portion 112 can be reduced by metal molding or pressing so that the pattern width is 0.5 mm. Using other methods such as etching, laser machining, cutting, and electrical discharge machining allows the pattern width to be increased. In the case of laser machining, if the machined surface is a rough surface, an anchor effect for composite resin plate 108 can be obtained.

Further, thin portion 114 can be metal molded so that the width of a gap of patterns is 0.2 mm. The metal molding may be carried out at one time. Alternatively, the molding may be divided into a plurality of processes (including outside processing of a hoop) and carried out at a plurality of time points for the plurality of divided processes. In addition, a wiring circuit can also be formed by application of laser beams or etching to foregoing thin portion 114. In the case of forming thin portion 114 using laser beams, the use of laser beams having a shorter wavelength and a shorter pulse width than those used for reducing the thickness of thick portion 112 can suppress thermal deterioration of a metal wiring plate. This allows a fine circuit pattern to be formed with high precision. As such a laser, an SHG laser may be mentioned. This laser has a short wavelength (532 nm) that is half that of infrared light, and the absorptivity to copper is high. Accordingly, the time period required for cutting is short, allowing the thermal deterioration of processed portions to be more reduced. In the case of processing using a laser, an oxide film can be formed on a processed surface, allowing improvement in electrical insulating properties between fine circuit patterns.

Note that if the foregoing SHG laser is used, the gap width between patterns can easily be formed to be not less than 0.01 mm nor more than 0.1 mm in the case of thin portion 114 having a thickness of 0.1 mm, and to be not less than 0.03 mm nor more than 0.2 mm in the case of thin portion 114 having a thickness of 0.2 mm. The resulting formation accuracy is in a range from 0.005 mm to +0.01 mm. In addition, the use of a laser, processing can be carried out so that the opening diameter is gradually decreased from a laser beam incident portion toward an end of processed area (laser beam outgoing portion). That is, the processed surface can be made in a taper structure. Putting resin from a portion having a larger opening diameter can make it easier that gaps between fine circuit patterns are filled with resin. The electrical insulating properties can be improved.

Thus, a heat generating component such as LED 102 can accept a high current, e.g., of 100 A by being mounted on foregoing thick portion 112. Further, its heat generating surface can radiate heat through thick portion 112, and further through composite resin plate 108 and heat sink 110. At the same time, control IC 104 for LED 102, chip component 106, and the like can be mounted on thin portion 114.

When LED 102 needs to be mounted on a very fine wiring circuit, LED 102 may be mounted on thin portion 114 where a fine wiring circuit pattern is formed. In this case, heat is rapidly transmitted from thin portion 114 toward thick portion 112, which is integrated with this thin portion 114, so that heat can be radiated efficiently to improve the luminance of LED 102. At this point, by making the area of a portion of the top surface of different thickness lead frame 100 (metal wiring plate) constituting thick portion 112 larger than the area of a portion of the top surface of different thickness lead frame 100 constituting thin portion 114, diffusion of heat is made easier. This can increase the heat radiation effect.

Note that while, in the embodiment, the thickness of thick portion 112 is reduced such that the section is trapezoidal as illustrated in FIG. 2, processing may be made such that a surface connecting from thin portion 114 to thick portion 112, which constitutes a side surface of different thickness lead frame 100 (circuit pattern), is made to be an inclined surface so that the section is substantially triangular. In this case, a fine circuit pattern can be achieved and a portion having a small thickness can be reduced as much as possible in thin portion 114 of different thickness lead frame 100. Thus, acceptance of a high current and high heat radiation can be achieved.

If the surface connecting from thin portion 114 to thick portion 112, which constitutes a side surface of different thickness lead frame 100, is made of a curved surface extending outward, from thin portion 114 toward thick portion 112, the stress generated by thermal expansion of resin provided below thin portion 114 for filling can be dispersed efficiently. This can improve thermal reliability.

Further, while, in the embodiment, a circuit pattern is formed by cutting out substantially the center of thin portion 114 as illustrated in FIG. 2, this portion for cutting-out may be positioned toward any one of different thickness lead frames 100. In this case, the areas of the top surfaces of thin portions 114 facing each other of different thickness lead frame 100 adjacent to each other are to be different from each other. At this point, if an electronic component is mounted with its heat generating portion facing smaller-area thin portion 114, heat is immediately transmitted to thick portion 112. The heat radiation can thus be improved.

Note that while, in the embodiment, different thickness lead frames 100 adjacent to each other are disposed such that their thin portions 114 are facing each other, they may be disposed such that thin portion 114 of any one of different thickness lead frames 100 faces thick portion 112 of the other different thickness lead frame 100. In this case, if an electronic component is mounted with its heat generating portion facing thick portion 112, improvement in heat radiation and a finer wiring pattern can be concurrently achieved.

Application to a power supply unit for use in plasma display panel (PDP), an inverter, a DC-DC converter, a high-current electrical apparatus mounted inside a vehicle in addition to a light emitting module is possible. A power element, such as a power transistor, a power choke coil, or a power semiconductor, that requires improvement of heat radiation is mounted on thick portion 112 and a control IC, a signal IC, or the like, which requires high density mounting, is mounted on thin portion 114. Integration and compactness of a module can be achieved.

Further, as an element to be mounted on thick portion 112, a high heat-generating laser element may also be mentioned. As an element mounted on thin portion 114, a diode and the like that require a fine pattern may also be mentioned.

(Second Embodiment)

As a second embodiment, one example of a method for manufacturing a heat radiating wiring board using a different thickness lead frame will be described below with reference to FIGS. 3A, 3B, 4, and 5.

Figure 3A:
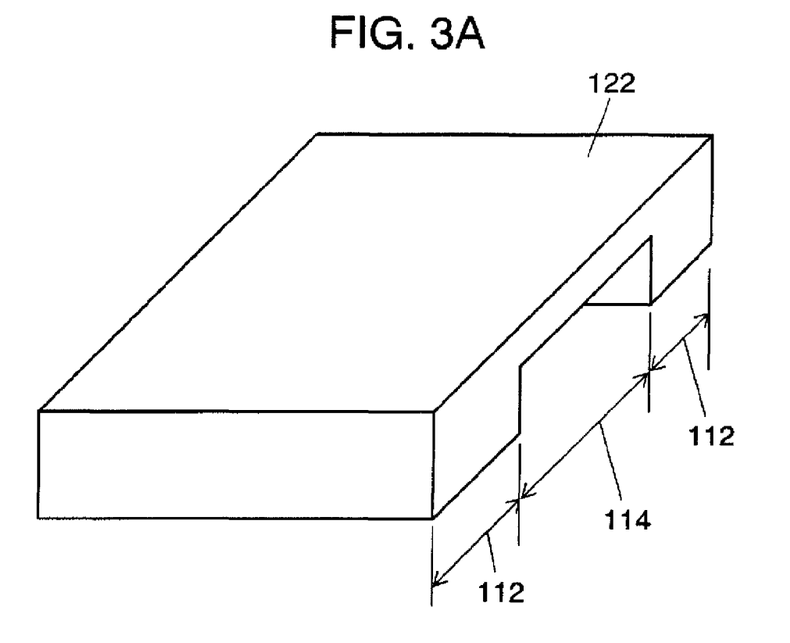
FIG. 3A is a perspective view explaining the state before pressing in a process of making a different thickness lead frame.
Figure 3B:
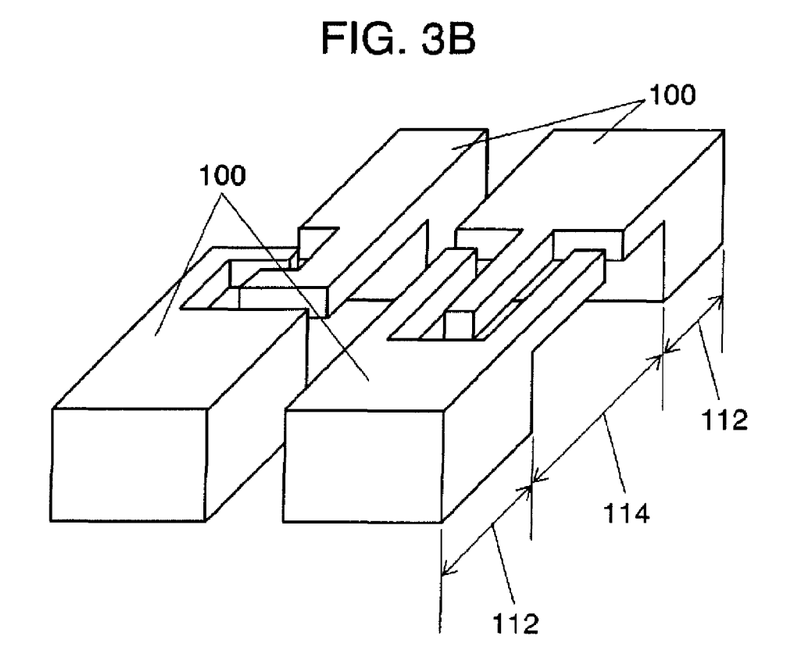
FIG. 3B is a perspective view explaining the state after pressing in the process of making the different thickness lead frame.

FIGS. 3A and 3B are perspective views explaining how to make different thickness lead frame 100; FIG. 3A illustrates the state of copper material 122 before pressing, FIG. 3B illustrates the state of copper material 122 after pressing. In FIG. 3A, copper material 122 is successive, irregular-shaped copper strips made by, e.g., roll forming of a thin plate mainly made of copper. Then, as illustrated in FIG. 3B, this copper material 122 is formed in a predetermined shape by pressing. Here, pressing is preferably carried out from the back side to the front side (from the lower side to the upper side in FIG. 3B). This allows a burr produced during pressing to escape to the front side (further can increase the effect of air permeability stainproof film 124 in FIG. 5 to be described later) and therefore formation accuracy can be increased. Deformation in thick portion 112 and thin portion 114 can be reduced.

Figure 4:
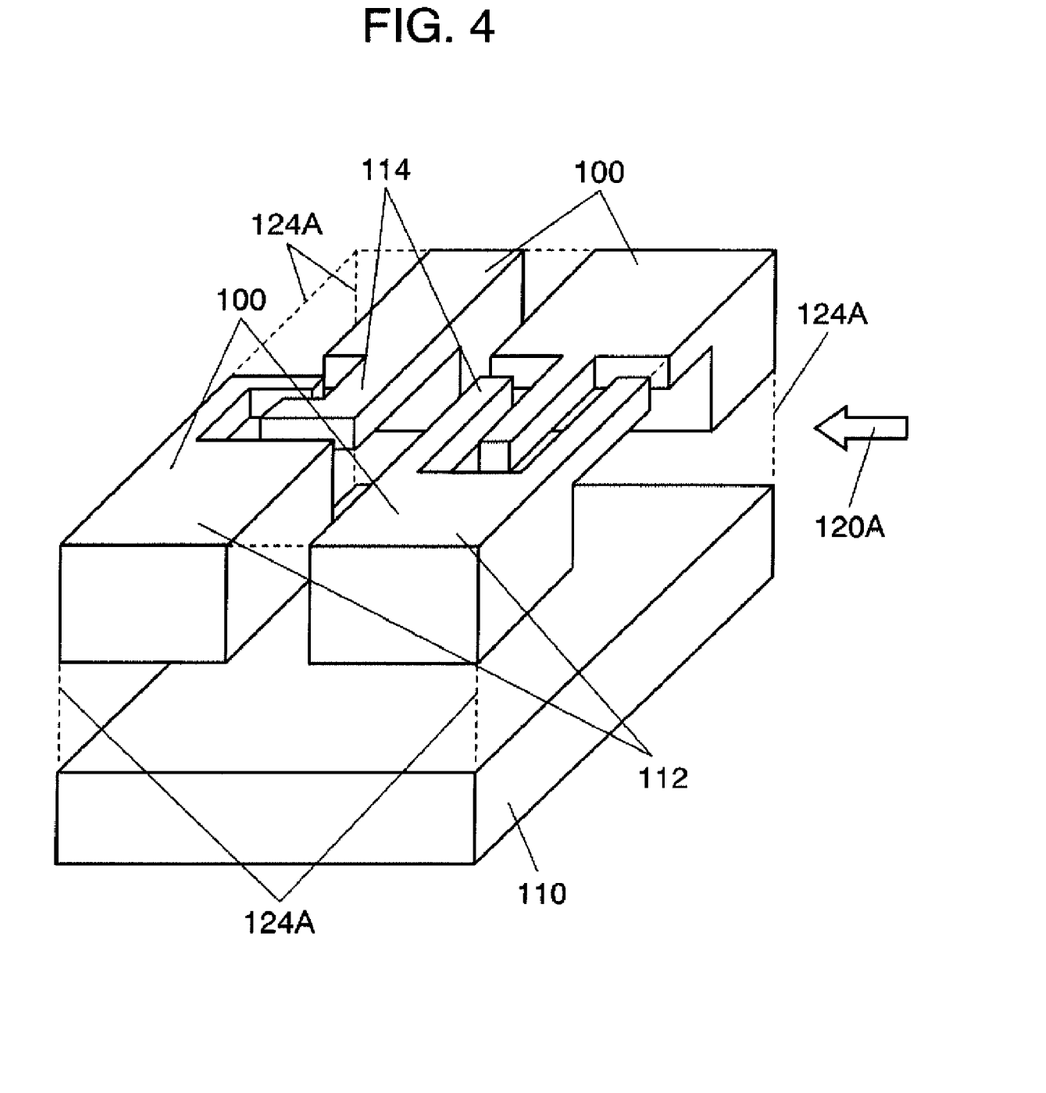
FIG. 4 is a perspective view illustrating a relationship of the different thickness lead frame and a heat sink.

FIG. 4 is a perspective view illustrating a relationship of different thickness lead frame and a heat sink. In FIG. 4, reference mark 124A denotes auxiliary lines, and it is illustrated that a space indicated by auxiliary lines 124A is filled with resin constituting composite resin plate 108 in the next process. Referring to FIG. 4, it is found that thick portions 112 adjacent to each other have wide pattern widths (e.g., a thickness of 0.5 mm and a pattern width of 0.5 mm) that are easy to use for high current applications whereas thin portions 114 adjacent to each other have narrow pattern widths (e.g., a thickness of 0.1 mm and a pattern width of 0.1 mm) that are easy to use for signal applications. That is, in the embodiment, the ratio of the thickness of thick portion 112 to the gap width of patterns of thin portion 114 is formed in 1 to less than 1 in order to achieve acceptance of a high current and fine pattern. Next, the figure seen from the direction of arrow 120A is illustrated in FIG. 5.

Figure 5:
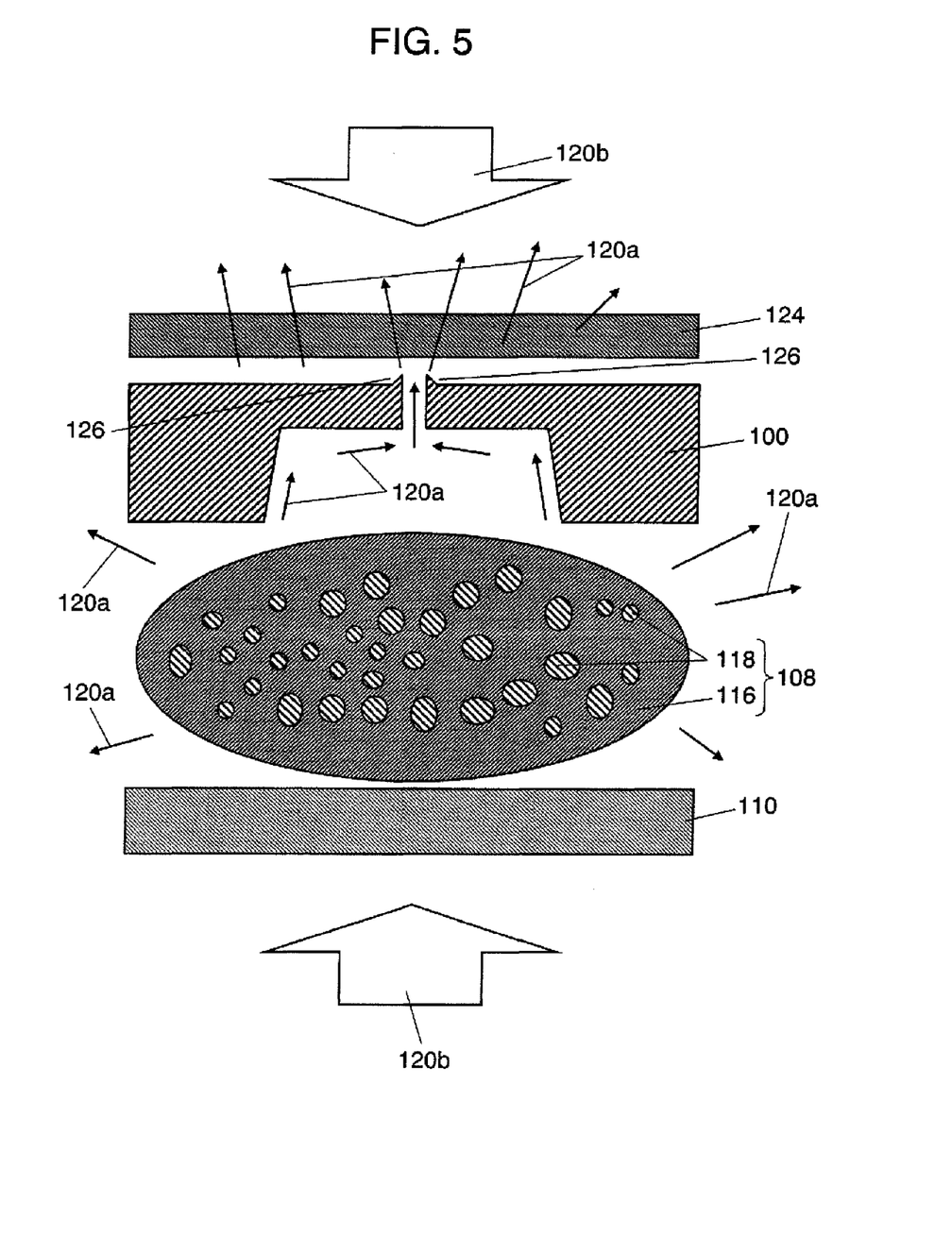
FIG. 5 is a sectional view illustrating the state of filling resin constituting a composite resin plate.

FIG. 5 is a sectional view illustrating how to use resin constituting composite resin plate 108 for filling, and corresponds to FIG. 4 observed from the direction of arrow 120A. In FIG. 5, at least filler 118 composed of inorganic powder and resin for composite resin plate 108 composed of insulating resin 116 are set between heat sink 110 and different thickness lead frame 100. Then, they are pressed using a pressing machine (hot press or vacuum hot press, etc.,) in the direction of arrows 120*b*. In pressing, air permeability stainproof film 124 is attached onto the surface of different thickness lead frame 100. Attachment of air permeability stainproof film 124 at this point causes air to be unlikely to be left in gaps of different thickness lead frames 100 (e.g., step portions between thick portion 112 and thin portion 114, and thin portions 114 formed at a fine pitch) during pressing. Even if air is left, it can escape through air permeability stainproof film 124. Here, arrows 120*a* illustrate air escaping during pressing. If air is left in such portions, a void is created in a portion of composite resin plate 108. This may affect thermal conductivity in this portion, and affect insulating properties of different thickness lead frame 100 and heat sink 110. Resin for composite resin plate 108 is preferably formed in advance to be round (or shell type, trapezoidal, cylindrical, spherical) as shown in FIG. 5. Formation in such a shape can ensure that resin for composite resin plate 108 flows around to every inch of different thickness lead frame 100 without air being left. As air permeability stainproof film 124, a non-woven fabric thinly coated with an adhesive may be used.

Burr 126 is produced when copper material 122 is cut out with a metal mold. By setting the direction of this burr 126 toward the side of air permeability stainproof film 124, it can be prevented that burr 126 cuts into air permeability stainproof film 124 during pressing to cause resin for composite resin plate 108 to flow into the surface of different thickness lead frame 100. In particular in the second embodiment, since thin portions 114 of different thickness lead frames 100 are formed at a fine pitch, making use of this burr 126 makes it possible to prevent resin for composite resin plate 108 from flowing around on a mounting surface (a surface on which control IC 104 and chip component 106 are mounted by soldering) of thin portions 114.

Note that thermosetting resin may be used as resin for composite resin plate 108. For example, it takes 10 minutes or more at 120° C. to cure uncured thermosetting resin to a sufficient degree of hardness for the resin to be taken out from a metal mold. To reduce this time to increase productivity, a pregel agent is added. The pregel agent is thermoplastic resin powder, and absorbs a liquid component of uncured, thermosetting, insulating resin and acts so that the uncured insulating resin becomes gel. It takes around 1 minute at 120° C. for the pregel agent acts to cure the resin to a sufficient degree of hardness for the resin to be taken out from a metal mold. This can increase productivity.

(Third Embodiment)

Figure 6:
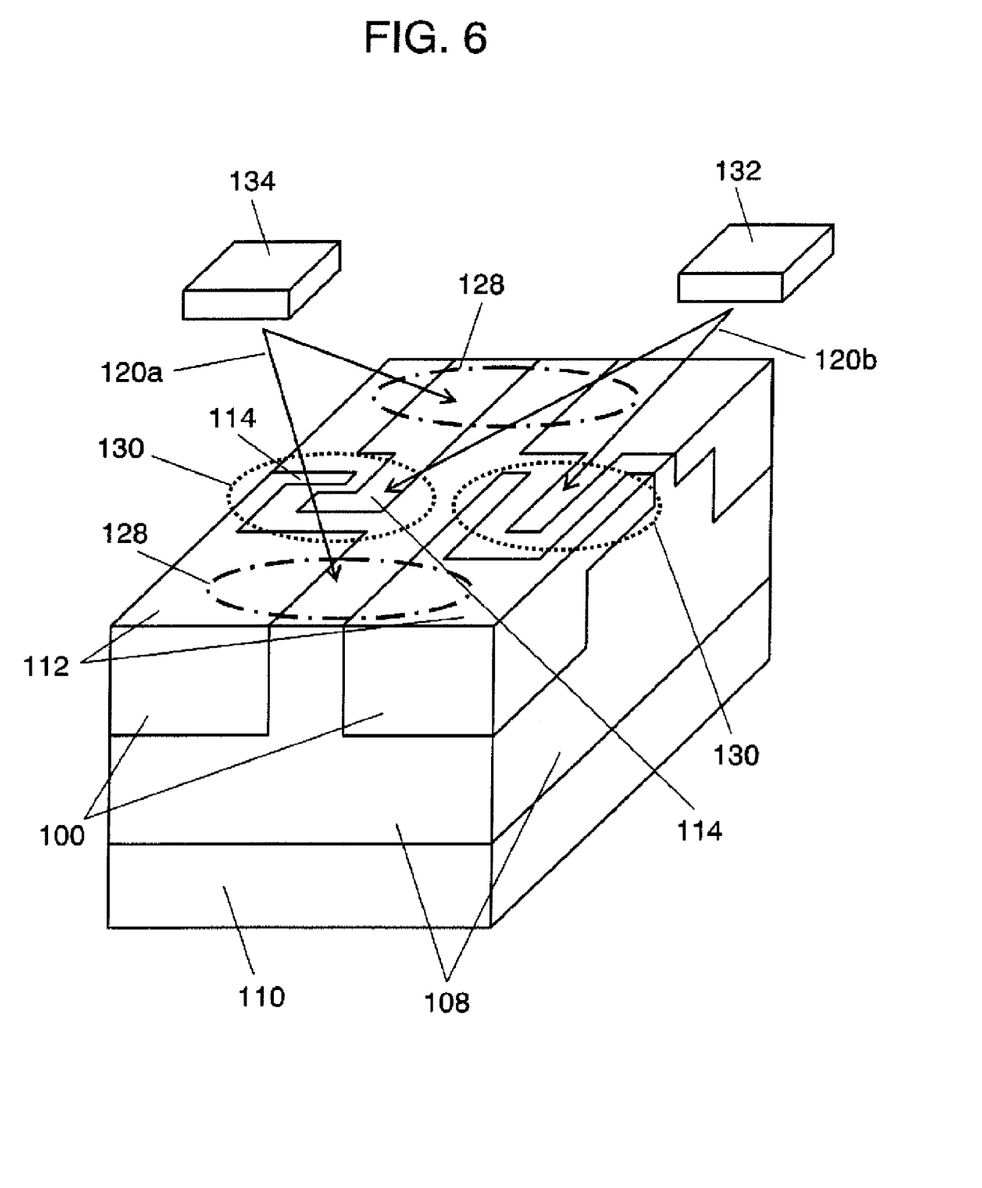
FIG. 6 is a perspective view explaining positions at which components are mounted on the heat radiating wiring board.

As a third embodiment, one example of optimum mounting of various electronic components onto a heat radiating wiring board will be described below with reference to FIGS. 6 to 8. FIG. 6 is a perspective view explaining a position for mounting a component on a heat radiating wiring board.

In FIG. 6, thick portion 112 of different thickness lead frame 100 is excellent in high current and heat radiation. This portion preferably constitutes high current heat radiation portion 128 such that power component 134 such as LED is mounted on the portion. On the other hand, fine and complex wiring can be formed on thin portion 114 of different thickness lead frame 100, and therefore thin portion 114 is optimum as signal circuit portion 130 and suitable for mounting of control component 132.

A tin plating process with a nickel underplate is applied to the surface (component mounting surface) of different thickness lead frame 100 in FIG. 6. In this way, tin plating and solder plating may be performed for soldering.

Figure 7:
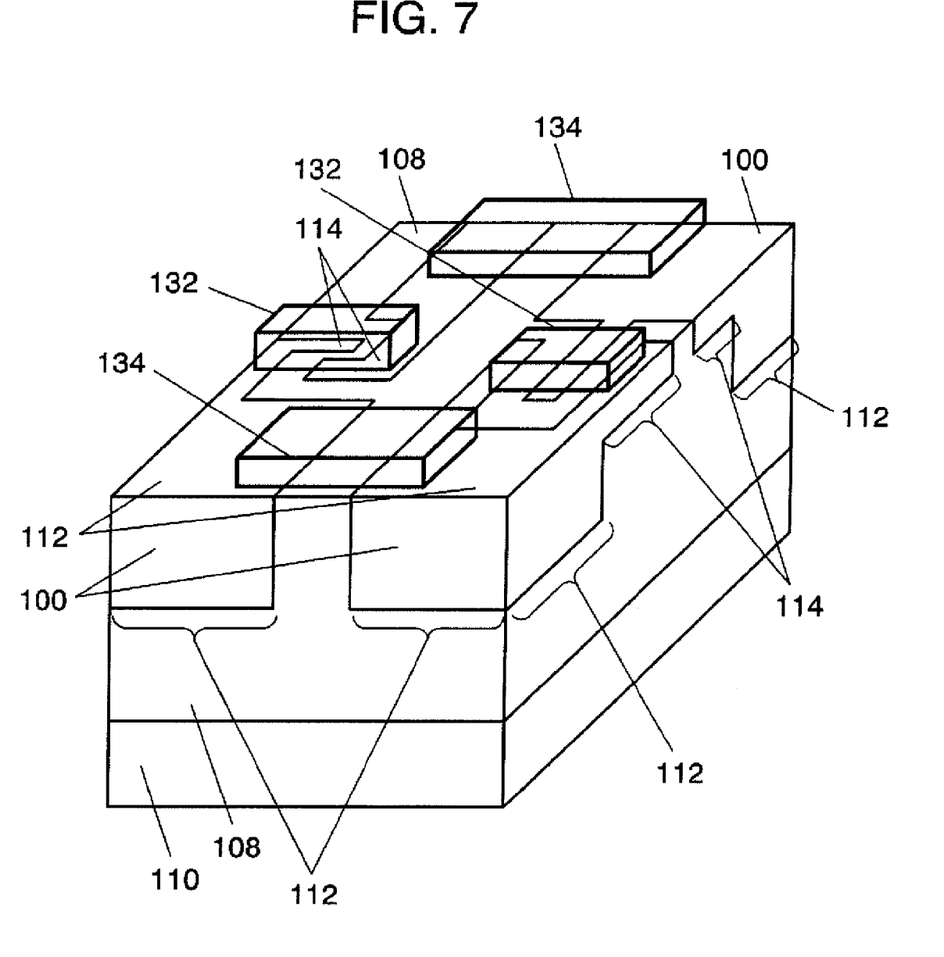
FIG. 7 is a perspective view illustrating the state of each component being mounted on the heat radiating wiring board.

FIG. 7 is a perspective view illustrating the state of each component being mounted. As illustrated in FIG. 7, power component 134, such as an LED, for which heat radiation and a high current are required is mounted on thick portion 112 and control component 132 is mounted on thin portion 114 so that circuits of these components can be closer to each other. This enables cost cutting and size reduction.

Figure 8:
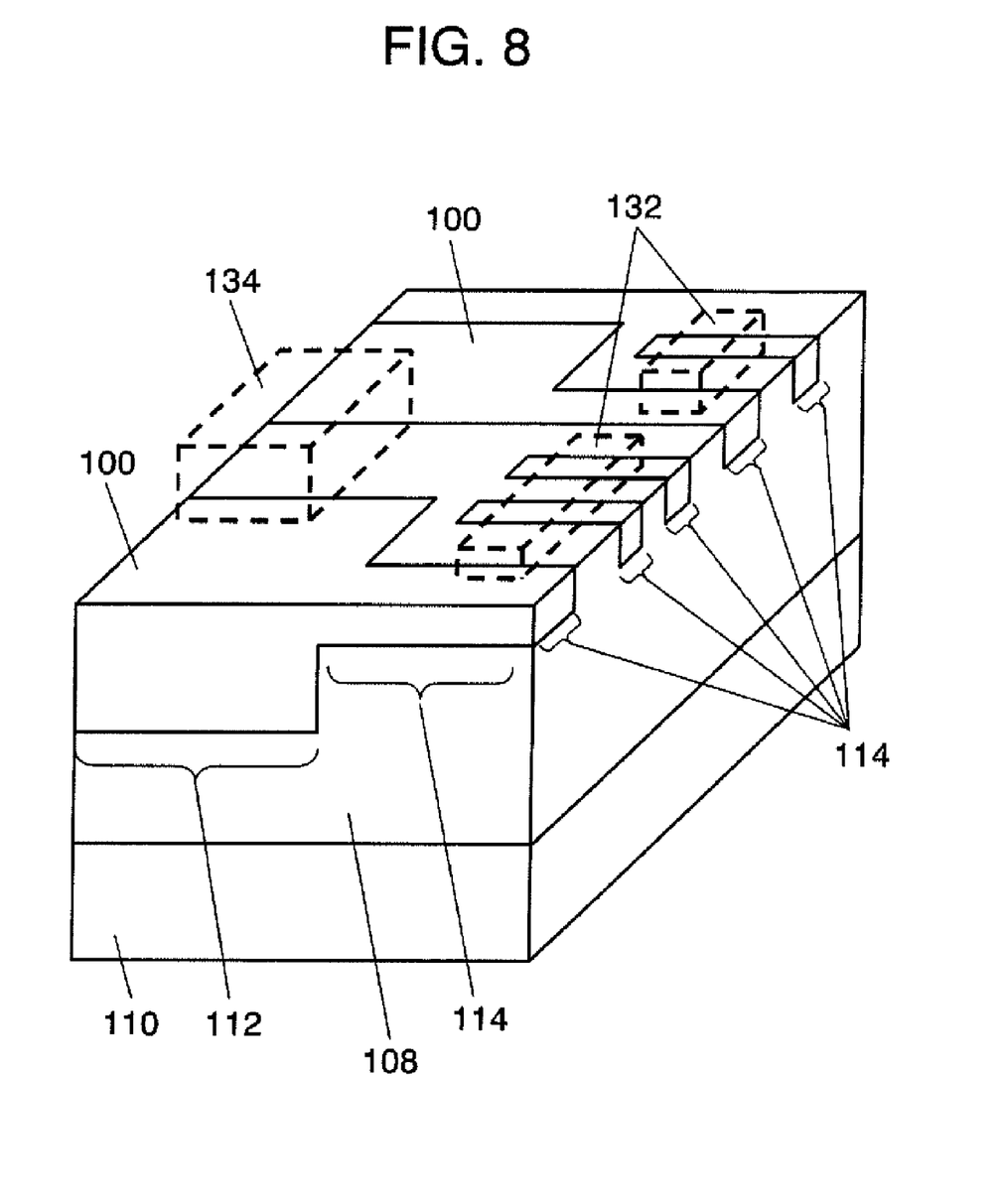
FIG. 8 is a perspective view of FIG. 7, seen from another direction.

FIG. 8 is a perspective view seen from another direction. As illustrated in FIG. 8, it is found that the wiring thickness of thin portion 114, which constitutes different thickness lead frame 100, is thin as compared with thick portion 112, but its wiring rule is detailed and fine.

(Fourth Embodiment)

Figure 9:
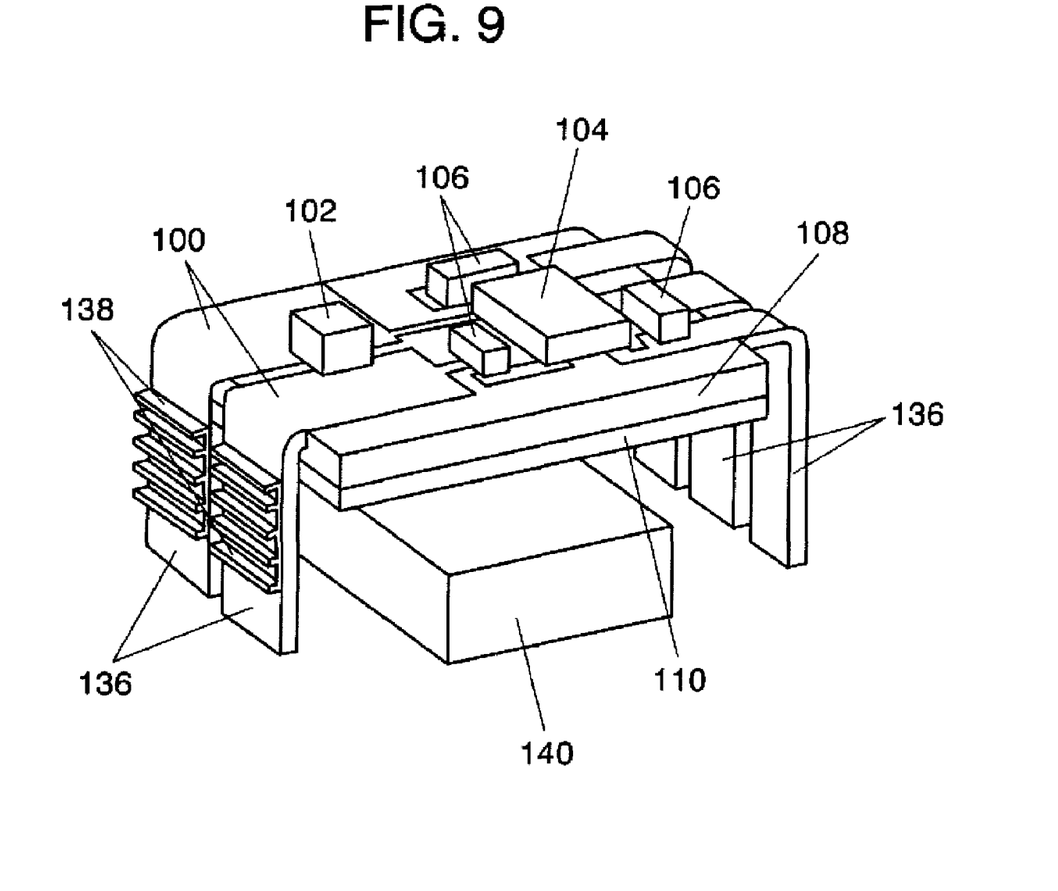
FIG. 9 is a perspective view illustrating a heat radiating wiring board in a fourth embodiment.

As a fourth embodiment, one example of increasing heat radiation of heat radiating wiring board will be described below with reference to FIG. 9. FIG. 9 is a perspective view illustrating one example of heat radiating wiring board in the fourth embodiment. In FIG. 9, an example of an electronic component for which a high current and high heat radiation are required, which is a feature of the invention, and a general surface mounting electronic component being concurrently mounted.

As in FIG. 9, part of different thickness lead frame 100 is bent so that the part is terminal electrode 136, and heat radiation fin 138 and the like are attached to this part. This can further increase heat radiation of a heat radiating wiring board of the invention. As illustrated in FIG. 9, different thickness lead frame 100 may be formed in a U-shape (or bridge-like). Formation in such a shape allows a heat radiating wiring board to be mounted on another circuit board (another circuit board is not illustrated in FIG. 9) and a gap to be provided between another circuit board and the heat radiating wiring board, so that heat of heat radiating wiring board is unlikely to be transmitted to another circuit board. Further, as illustrated in FIG. 9, another component 140 maybe mounted on the gap.

Note that it is preferable that the section of different thickness lead frame 100 be substantially quadrangular. Forming the section in a substantial quadrangle makes it possible to flow a high current at the maximum density with the limited area. Different thickness lead frame 100 needs to have one or more surfaces in contact with composite resin plate 108. Three surfaces of different thickness lead frame 100 in contact with composite resin plate 108 can increase heat conduction efficiency from different thickness lead frame 100 to composite resin plate 108, and further increase the adhesion (removal difficulty) of different thickness lead frame 100 and composite resin plate 108. Particularly in thin portion 114 of different thickness lead frame 100, the finer the wiring pattern, the area of contact with composite resin plate 108 relatively decreases. Therefore, it is preferable that three surfaces of different thickness lead frame 100 be in contact with composite resin plate 108. By exposing the remaining one surface from composite resin plate 108 as illustrated in FIGS. 7 and 8, the mounting strength can increased.

Note that in the case of making copper material 122 in a shape of different thickness lead frame 100 by machining, a sheet metal coil having the long length such as from 10 to 100 m can be continuously machined. In this machining, the surfaces on sides on which the component mounting surface of different thickness lead frame 100 is not placed (that is, surfaces in contact with composite resin plate 108) are preferably roughened (making rough surfaces). By roughening at least the surface in contact with composite resin plate 108, the bite (or anchor effect) with composite resin plate 108 can be increased in the case of different thickness lead frame 100 being further made in a finer pattern.

As described above, different thickness lead frame 100 is attached to a resin plate having insulating properties into which filler made, e.g., of inorganic ceramic is mixed, and part of a circuit pattern forming the board has a thickness thinner than that of a portion other than the part. The use of the different thickness lead frame 100 can achieve a heat radiating wiring board that allows thin portion 114 to be further formed in a finer pattern. Also, attaching different thickness lead frame 100 onto composite resin plate 108 allows only one surface having the substantially quadrangular section of different thickness lead frame 100 to be in contact with composite resin plate 108.

Also, embedding different thickness lead frame 100 in composite resin plate 108 having insulating properties into which filler is mixed and allows three surfaces having the substantially quadrangular sections of different thickness lead frame 100 to be in contact with composite resin plate 108. The heat radiation and bonding can thus be increased.

Also, making the thickness of thin portion 114 of different thickness lead frame 100 thin allows part of thin portion 114 of different thickness lead frame 100 to be locally formed in a fine pattern. Various surface mounting components can thus be mounted with high density.

Also, the use of different thickness lead frame 100 increases, in processing a conductive metal plate having a thickness of 0.05 mm or more, the ease of handling during processing because of having thick portion 112, and allows a heat radiating wiring board that allows concurrent achievement of a high current and a finer pattern to be provided.

Also, the use of different thickness lead frame 100 allows a circuit pattern to be formed to have two or more different thicknesses. A heat radiating wiring board that allows concurrent achievement of a high current and a finer pattern can therefore be provided.

Also, formation of different thickness lead frame 100 is performed by processing a conductive metal plate formed with different thicknesses in a rolling process by a roller. A heat radiating wiring board that allows a circuit pattern to meet the demands for a high current and a finer pattern can thus be provided at low cost.

Also, different thickness lead frame 100 can be fabricated by applying pressure to part of conductive metal plate by using a press and a metal mold to reduce the thickness. A heat radiating wiring board that allows concurrent achievement of a high current and a finer pattern can therefore be provided.

Also, a thin portion that is included in thin portion 114 constituting different thickness lead frame 100 is cut out using a press and a metal mold so that different thickness lead frame 100 is formed in a fine pattern. A heat radiating wiring board that allows concurrent achievement of a high current and a finer pattern can therefore be provided.

Also, a portion of thin portion 114 constituting different thickness lead frame 100 is formed in a fine pattern by etching, laser machining, or wire electrical discharge machining. A heat radiating wiring board that allows concurrent achievement of a high current and a finer pattern can therefore be provided.

Also, with part of different thickness lead frame 100 as a circuit pattern, part of the circuit pattern protrudes outside the board to constitute a heat radiation portion according to the invention. By providing this portion with a heat radiation function, heat radiation as well as a high current and a finer pattern can be concurrently achieved.

Also, with part of different thickness lead frame 100 as a protruding pattern, the protruding pattern has a function of a terminal. Heat radiation as well as a high current and a finer pattern can thus be concurrently achieved.

Also, with part of different thickness lead frame 100 as a protruding pattern, heat radiation fins are formed on at least one side of the protruding pattern using shaving or the like. Heat radiation as well as a high current and a finer pattern can thus be concurrently achieved.

Also, heat radiation fins are attached to on one or more sides of the protruding pattern. Heat radiation as well as a high current and a finer pattern can thus be concurrently achieved.

Also, a composite resin plate in which at least one kind of filler of $Al_2O_3$, Mgo, $SiO_2$, BN, AlN, SiC, and ZnO filler is contained in resin having epoxy as the base compound is used. Heat radiation as well as a high current and a finer pattern can thus be concurrently achieved.

Also, 70 to 95 percent by weight of the filler is contained. Heat radiation as well as a high current and a finer pattern can thus be concurrently achieved.

Also, a pattern with part of different thickness lead frame 100 protruding is formed, and this pattern that protrudes and has a terminal function is bent so that the board is mounted while floating from a mother board. Thus, different thickness lead frame 100 can be excellent in heat radiation, high current, fine pattern, and mountability.

Also a different thickness lead frame partially having different thicknesses is heated by using a press and resin to which filler is added, so that the different thickness lead frame is integrated. Thus, a heat radiating wiring board excellent in heat radiation, high current, and fine pattern can be manufactured at low cost.

Industrial Applicability

As described above, by using a heat radiating wiring board and a manufacturing method therefor of the invention, various electronic components, such as an LED, that require a high current and heat radiation and peripheral circuit components for driving the electronic components can be mounted adjacent to each other on the same board. Therefore, unitizing and modularizing these circuits become possible. This can contribute to size reduction, high performance, and cost reduction of products. Thus, the industrial applicability is very high.

The invention claimed is:

1. A heat radiating wiring board having two generally planar parallel surfaces, comprising:
    a plurality of circuit patterns each comprising a metal wiring plate;
    a resin plate having insulating properties into which filler is mixed; and
    a heat sink, wherein:
    the circuit patterns are attached to one side surface of the resin plate,
    a top surface of the circuit pattern is exposed at the one side surface of the resin plate, and substantially flush with a top surface of the resin plate,
    the heat sink is attached to the other side surface of the resin plate,
    each circuit pattern of the circuit patterns is a single metal wiring plate, which has a thick portion and a thin portion thinner than the thick portion in a thickness direction of the resin plate, an inclined side surface connecting the thin portion and the thick portion in the circuit pattern,
    the inclined side surface having an inclination angle of more than zero degrees with respect to a plane perpendicular to the two generally planar surfaces of the wiring board, and
    a thickness of the resin plate between the thick portion and the heat sink is smaller than a thickness of the resin plate between the thin portion and the heat sink.

2. A heat radiating wiring board having two generally planar parallel surfaces, comprising:
    at least one circuit pattern comprising a metal wiring plate;
    a resin plate having insulating properties into which filler is mixed; and
    a heat sink, wherein:
    the at least one circuit pattern is embedded in the resin plate,
    a top surface of the circuit pattern is exposed at the one side surface of the resin plate, and substantially flush with a top surface of the resin plate,
    the heat sink is attached to the resin plate but is non-conducting with the at least one circuit pattern;
    a thickness of a part of the at least one circuit pattern is less than the thickness of a portion other than the part in the metal wiring plate, an inclined surface connecting the thin portion and the thick portion in the circuit pattern,
    the inclined side surface having an inclination angle of more than zero degrees with respect to a plane perpendicular to the two generally planar surfaces of the wiring board, and
    a thickness of the resin plate between the thick portion and the heat sink is smaller than a thickness of the resin plate between the thin portion and the heat sink.

3. The heat radiating wiring board according to claim 1 or 2, wherein the thick portion has a thickness not less than 0.3 mm nor more than 1.0 mm.

4. The heat radiating wiring board according to claim 1 or 2, wherein the metal wiring plate constituting the at least one circuit pattern having two or more different thicknesses in a same plate.

5. The heat radiating wiring board according to claim 1 or 2, wherein:
    the at least one circuit pattern includes a plurality of circuit patterns adjacent to each other;
    thin portions of the plurality of circuit patterns face each other; and
    areas of top surfaces of the plurality of circuit patterns constituting the thin portions are different from each other.

6. The heat radiating wiring board according to claim 1 or 2, wherein:
    the at least one circuit pattern includes a plurality of circuit patterns adjacent to each other; and
    a thin portion of any one of the plurality of circuit patterns faces a thick portion of an other one of the plurality of circuit patterns.

7. The heat radiating wiring board according to claim 1 or 2, wherein a surface connecting from a thin portion to a thick portion, the surface constituting a side surface of the at least one circuit pattern, is an inclined surface.

8. The heat radiating wiring board according to claim 1 or 2, wherein an area of a top surface of the at least one circuit pattern constituting a thick portion is larger than the area of a top surface of the at least one circuit pattern constituting a thin portion.

9. The heat radiating wiring board according to claim 1 or 2, wherein a part of the at least one circuit pattern protrudes from the resin plate and constitutes a heat radiation portion.

10. The heat radiating wiring board according to claim 1 or 2, wherein a part of the at least one circuit pattern protruding from the resin plate constitutes a terminal.

11. The heat radiating wiring board according to claim 1 or 2, wherein a part of the at least one circuit pattern protruding from the resin plate constitutes a heat radiation fin.

12. The heat radiating wiring board according to claim 1 or 2, wherein heat radiation fin is attached to a part of the at least one circuit pattern protruding from the resin plate.

13. The heat radiating wiring board according to claim 1 or 2, wherein the resin plate is a composite resin plate in which at least one or more kinds of filler among $Al_2O_3$, MgO, $SiO_2$, BN, AlN, SiC, and ZnO filler are contained in resin having epoxy as a base compound.

14. The heat radiating wiring board according to claim 1 or 2, wherein:
    the resin plate is a composite resin plate in which at least one or more kinds of filler among $Al_2O_3$, MgO, $SiO_2$, BN, AlN, SiC, and ZnO filler are contained in resin having epoxy as a base compound; and
    an amount of the filler added is 70 percent by weight or more and 95 percent by weight or less.

15. The heat radiating wiring board according to claim 1 or 2, wherein the metal wiring plate is tough pitch copper.

16. An electrical apparatus comprising the heat radiating wiring board according to claim 1 or 2, wherein an element is mounted on a thick portion of the at least one circuit pattern, the element having heat generating properties higher than the heat generating properties of an element mounted on a thin portion of the at least one circuit pattern.

17. An electrical apparatus comprising the heat radiating wiring board according to claim 1 or 2, wherein:
   at least one of a laser element, an LED, a power transistor, a power choke coil, and a power semiconductor is mounted on and electrically connected to a thick portion of the at least one circuit pattern; and
   at least one of a control IC, a signal IC, a diode, and a minute LED is mounted on a thin portion of the at least one circuit pattern.

18. A method for manufacturing a heat radiating wiring board having two generally planar parallel surfaces, comprising:
   heating a metal wiring plate partially having parts of different thicknesses by using a press and resin into which filler is added, so that the metal wiring plate becomes integrated into the resin,
   wherein a thickness of a part of the at least one circuit pattern is less than the thickness of a portion other than the part in the metal wiring plate, a side surface connecting a thin portion and a thick portion in the circuit pattern is an inclined surface having an inclination angle of more than zero degrees with respect to a plane perpendicular to the two generally planar surfaces of the wiring board, and a thickness of the resin plate between the thick portion and the heat sink is smaller than a thickness of the resin plate between the thin portion and the heat sink.

19. The method for manufacturing a heat radiating wiring board according to claim 18, wherein the metal wiring plate constituting at least one circuit pattern is formed to have different thicknesses in a rolling process by a roller.

20. The method for manufacturing a heat radiating wiring board according to claim 18, wherein part of the metal wiring plate is thinned by any one method of press working, metal molding, etching, laser machining, cutting, and electrical discharge machining.

21. The method for manufacturing a heat radiating wiring board according to claim 18, wherein a thin part of the metal wiring plate is cut out using a press or a metal mold to form a fine pattern.

22. The method for manufacturing a heat radiating wiring board according to claim 18, wherein etching, laser machining, or wire electrical discharge machining is applied to a thin part of the metal wiring plate to form a wiring circuit.

23. The heat radiating wiring board according to claim 1 or 2, wherein the inclination angle is ranged within 3 to 10 degrees.

24. The method for manufacturing a heat radiating wiring board according to claim 18, wherein the inclination angle is ranged within 3 to 10 degrees.

* * * * *